United States Patent [19]

Blanchard

[11] Patent Number: 4,929,991
[45] Date of Patent: May 29, 1990

[54] RUGGED LATERAL DMOS TRANSISTOR STRUCTURE

[75] Inventor: Richard A. Blanchard, Los Altos, Calif.

[73] Assignee: Siliconix Incorporated, Santa Clara, Calif.

[21] Appl. No.: 334,806

[22] Filed: Apr. 5, 1989

Related U.S. Application Data

[63] Continuation of Ser. No. 119,761, Nov. 12, 1987, abandoned.

[51] Int. Cl.[5] ............................................. H01L 29/78
[52] U.S. Cl. .................................. 357/23.8; 357/23.4; 357/20
[58] Field of Search .................... 357/23.8, 20, 23.4

[56] References Cited

U.S. PATENT DOCUMENTS

| | | | |
|---|---|---|---|
| 4,686,551 | 8/1987 | Mihara | 357/23.4 |
| 4,767,722 | 8/1988 | Blanchard | 437/41 |
| 4,803,532 | 2/1989 | Mihara | 357/20 |
| 4,819,044 | 4/1989 | Murakami | 357/23.8 |

FOREIGN PATENT DOCUMENTS 59-100570  6/1984  Japan ..................... 357/23.8

Primary Examiner—William D. Larkins
Attorney, Agent, or Firm—Skjerven, Morrill, MacPherson, Franklin & Friel

[57] ABSTRACT

A lateral DMOS transistor includes a high conductivity substrate having an epitaxial layer grown thereon to have a resistivity suitable for the transistor body. A highly doped topside body contact is diffused into the epitaxial layer along with an abutting heavily doped source. The source is self-aligned with a conductive polysilicon gate lying on top of a thin gate oxide. After source diffusion the gate is oxide coated so as to be fully insulated. A main drain electrode portion is diffused near the opposing side of the gate spaced a distance away. A lightly doped drain region portion extends between the main drain region and the edge of the gate providing the required surface breakdown behavior. The main drain diffusion portion is extended into the epitaxial layer so that the spacing between the heavily doped substrate and the drain diffusion produces depletion region reach through at a voltage that is lower than the drain avalanche voltage. Several embodiments are set forth for practicing the invention.

8 Claims, 2 Drawing Sheets

RUGGED LATERAL DMOS TRANSISTOR STRUCTURE

This application is a continuation of application Ser. No. 078,119,761, filed 11/12/87, now abandoned.

BACKGROUND OF THE INVENTION

1. Field of the Invention

This invention relates to diffused metal oxide semiconductor (DMOS) transistors and more particularly relates to lateral DMOS structures suitable for high-power operation.

2. Description of the Prior Art

DMOS power transistors are well-known in the art, but most prior art devices have their drain electrodes connected to the device substrate. Therefore, when the device is mounted in a power transistor housing an undesirably high drain capacitance is produced In prior art lateral DMOS power transistors a low drain capacitance is achieved, but the drain to source breakdown voltage is determined by the device surface conditions. Therefore, when breakdown does occur, and a rush of drain current develops, the result is a surface damaged structure which is no longer useful.

The processes used to create the structures disclosed herein can be achieved using the conventional elements found in planar PN-junction isolated monolithic integrated circuits. For example, the processes and structures disclosed in the book ANALOG INTEGRATED CIRCUIT DESIGN, by Alan B. Grebene (Litton Educational Publishing, Inc. 1972) can be employed. The teaching in this book is incorporated herein by reference.

FIG. 1 shows a conventional power DMOS transistor configuration. While a single device is shown, a power transistor will involve a suitably large number of such devices connected in parallel. The number being determined by the current carrying requirement. The device is constructed upon an N+ wafer 10. An epitaxial layer 11 is grown on substrate 10 and is doped N-type to a level desired for the DMOS transistor drains. A P-type body 12 is diffused into the epitaxial layer to create a junction therewith. Body 12 is shown as a pair of diffusions but it can actually be a variety of forms. Its shape at the silicon surface determines the outer confines of the DMOS transistor. The shape can be round, oval, rectangular, hexagonal, interdigitated, or any other form as determined by the designer.

A source 13 is diffused into the body 12 region so as to extend part way therethrough. It is designed to be spaced a controlled distance away from the inner confines of body 12. A thin gate oxide 14 is formed at the silicon surface to span that portion of body 12 that exists adjacent to source 13. A gate electrode 15, preferably composed of conductive polycrystalline silicon (polysilicon) extends over the gate oxide 14 so as to span the space between the source regions as shown.

A field or thick oxide 16 is typically formed over the silicon surface at the perimeter of the immediate device area. A layer of oxide 17 is usually formed over gate 15 so that the polysilicon electrode is fully encapsulated in insulation. A cut is made in the surface oxide layers so as to expose portions of both the body 12 and source 13. Metallization 18 is formed on the device and etched back as shown so as to contact both the source and body. This metal forms the device source as shown schematically at 18'. The gate contact is shown schematically at 15' and the drain contact to the N+ substrate is shown at 10'.

In operation the PN junction formed between body region 12 and drain region 11 is back-biased by the applied voltage The conduction across such a reverse-biased junction is due to leakage which is quite small. When the gate 15 is positively biased its electric field can invert the conductivity of the adjacent body and create an N-type channel (not shown) that extends along the silicon surface from source 13 to drain 11. This channel can conduct and, if the gate is biased sufficiently, the conduction can be substantial. Electrons from source 13 can flow across the channel in body 12 and into drain 11 where they pass our via substrate 10 to electrode 10'.

The structure of FIG. 1 produces an excellent DMOS transistor, but several drawbacks are evident. Since the gate spans the inner portions of body 12 it must also span a significant portion of drain 11. This will lead to a substantial gate-to-drain overlap capacitance which is parasitic and detrimental to high frequency performance. It will be noted that substrate 10 forms the drain conduction path. In the case of a power transistor structure, where the DMOS transistor is housed in a power package, the drain electrode will ordinarily be connected to a metal housing. This will be the metal case for a TO-3 housing or the metal tab of a TO-202 or TO-220 housing. Such structures involve substantial additional stray drain capacitance which must be charged and discharged if the drain voltage is to be modulated.

FIG. 2 illustrates a lateral DMOS power transistor structure which avoids most of the drain capacitance problem. In this device a P-type silicon substrate 21 is employed in fabrication. The substrate resistivity is chosen to provide the desired DMOS body performance. A P+ body contact is diffused into the silicon surface at 22. This provides a topside ohmic contact to the substrate. An N+ source 23 is also diffused into the silicon. As shown, the source and body regions abut each other and are shorted together by a metal contact 24. Body contact and source regions 22 and 23 are linear structures that extend along the silicon surface and their extent defines the DMOS transistor shape. Metal contact 24 also extends along the silicon surface to the same extent.

A more heavily doped body region 25 is incorporated into the structure. As shown by dashed outline, this body region extends into the P-type substrate around source 23. Region 25 is achieved using an impurity diffusion that is extended beyond the confines of source region 23.

A drain electrode is diffused into the silicon substrate at 26. This N-type drain region extends over the silicon surface parallel to source 23. It forms a PN junction with the P-substrate and an N+ contact region 27 makes a low resistance ohmic connection to region 26. It is to be understood that the right-hand portion of FIG. 2 represents the center of the drain diffusion 26. In the actual structure a mirror image of that shown exists to the right. A second P+ region along with a second N+ source are spaced away from and facing the other edge of drain diffusion 26. From a process standpoint, P+ region 22 can be produced using an IC boron "isolation-like" diffusion and region 25 by an "NPN transistor base-like" diffusion. N+ regions 23 and 27 can be "an NPN transistor emitter-like" diffusion. Drain region 26 is typically a phosphorous diffusion that is driven in during the drive-in of P+ region 22. It is preferred that ion implantation be employed to deposit the various impurities because such a process is easily masked and can produce precise quantities of dopant. Thus, it can be seen that the topology of the device is determined by the surface shape of P+ region 22 and its mirror image.

Gate 28 is preferably composed of conductive polysilicon and is located over a thin gate oxide 29. This gate is employed in the fabrication process to self-align the formation of source region 23. This self alignment will locate the right hand portion of source 23 with respect to the left hand portion of gate 28. The other side of the gate, the right-hand portion, is in self register with N−-region 33 which is a lightly doped diffusion that extends to drain 26. As shown in FIG. 2, gate 28 is also overcoated with an insulating oxide 30 which can either be grown out of the gate polysilicon or deposited thereon. The right-hand edge of gate 28 is made to lie well inside the edge of drain diffusion 26 as shown. The dimension and doping concentration of N−-region 33 determines the breakdown voltage of the device. A metal contact 31 makes an ohmic connection to N+ contact region 21 in the conventional manner and the metal is caused to extend up over the planar oxide 32. This metal extension is terminated before the edge of gate 28. However, if desired, metal 24 can be extended up and partially over gate 28.

It can be seen that source region 23 is separated from drain extension 33 by a portion of P-type silicon substrate that acts as the DMOS transistor body. When gate 28 is biased sufficiently positive, the adjacent P-type body material becomes inverted and a channel will exist between source 23 and drain extension 33. If body region 25 is more heavily doped P-type than substrate 21, the gate will have to be biased more positively to create a channel and the DMOS threshold is higher. However, if desired, body region can be compensated by diffusing N-type impurities into the silicon at 25 and the DMOS threshold will be lowered to that level determined by the substrate 21 doping. Clearly the threshold can be controlled independently from the other device parameters.

It will be noted that the drain capacitance is only that produced by the drain PN junction. Furthermore, the gate to drain capacitance is minimized. So too is the gate to source capacitance. Finally, since the substrate is connected to the housing, the source/body contact is connected to the metal tab or housing in a power structure.

The major problem with the structure of FIG. 2 is that drain avalanche breakdown voltage is initiated by the silicon surface where region 33 forms a junction with substrate 21. This breakdown is therefore a function of the nature of the silicon-oxide interface which is difficult to control.

SUMMARY OF THE INVENTION

It is an object of the invention to create a lateral DMOS transistor having a drain breakdown voltage that is controlled by depletion region reach through which is lower than the junction avalanche voltage which is initiated by surface breakdown. The device breakdown region therefore is located in the bulk semiconductor portion.

It is a further object of the invention to employ a high conductivity semiconductor substrate having an epitaxial layer grown thereon which contains the active device elements of a lateral DMOS transistor and the drain depletion region is designed to reach through to the substrate at a voltage that is below the junction avalanche surface controlled breakdown voltage.

These and other objects are achieved using a high conductivity silicon wafer which has an epitaxial layer grown thereon having a conductivity suitable for the DMOS transistor body. A high conductivity body contact is then diffused into the surface adjacent to a high conductivity opposite conductivity type source. The source is created in alignment with one edge of a polysilicon gate which is located upon a thin gate oxide. A drain region is diffused into the surface a distance from the other edge of the gate. A lightly-doped drain-extension region extends from the drain region to the edge of the gate. An ohmic contact to the drain diffusion is also created in the semiconductor surface. A metal drain contact makes a low resistance connection to the drain diffusion.

The body contact and that portion of the source facing away from the gate are exposed with a contact etch and a metal contact is made thereto. A contact is also made to the polysilicon gate. The resulting lateral DMOS transistor has a drain region that extends a short distance into the epitaxial layer so as to be close to the heavily doped substrate. The device processing is controlled so that the vertical depletion region reach through voltage of the drain electrode is below that of the drain avalanche voltage. Thus, the voltage breakdown mechanism is confined to the semiconductor bulk rather than the surface.

The breakdown voltage can be controlled by the drain diffusion and the epitaxial layer thicknesses. It can further be controlled by the impurity distribution in the drain region. The drain region can include a high concentration buried layer as an alternative. In another alternative the epitaxial layer can include a high conductivity buried layer which interconnects the body contact region and the substrate.

The various figures are not to scale. The vertical dimensions are exaggerated to better illustrate the nature of the invention.

DESCRIPTION OF THE INVENTION

Figure 1:
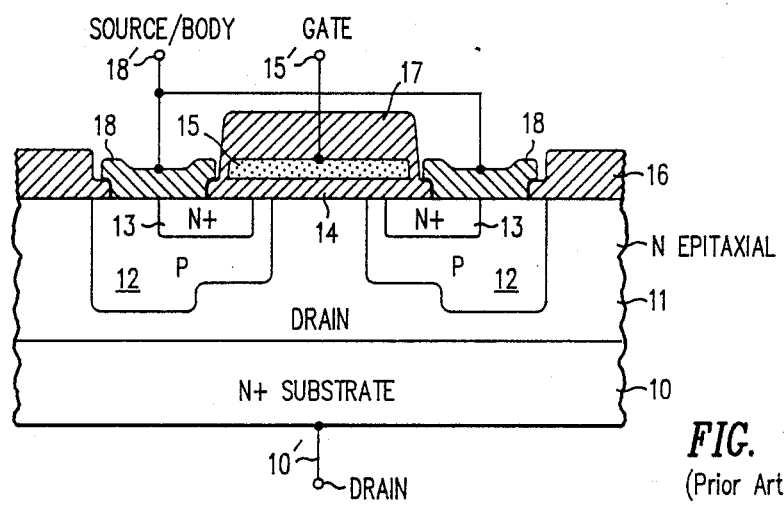
FIG. 1 is a cross-section view of a portion of a semiconductor wafer containing a prior art power DMOS transistor.
Figure 2:
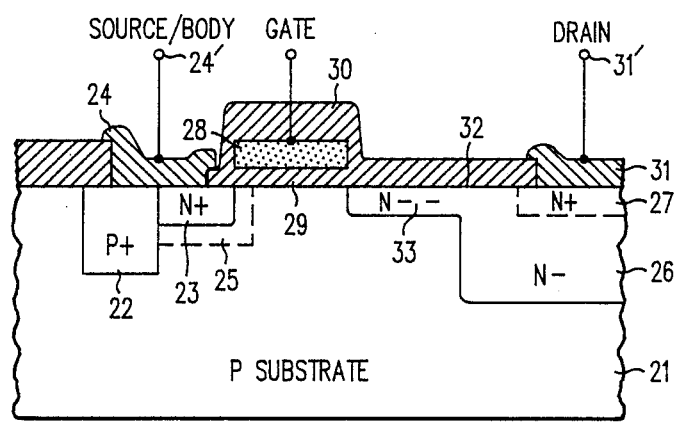
FIG. 2 is a cross-section view of a portion of a semiconductor wafer containing a prior art lateral DMOS transistor.
Figure 3:
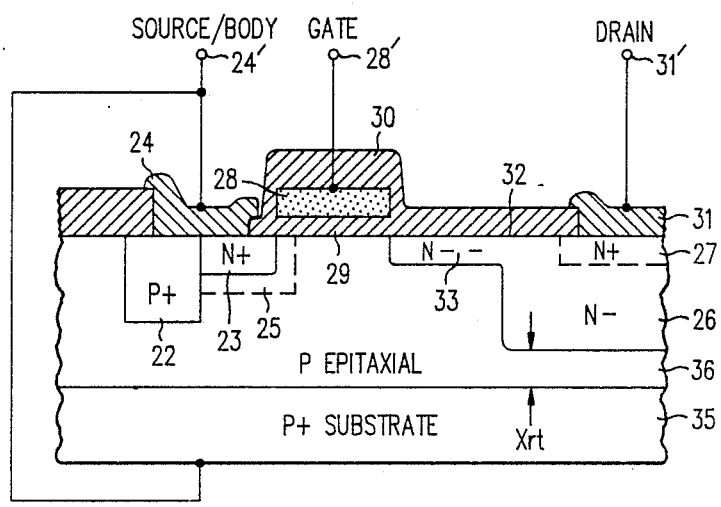
FIG. 3 is a cross-section view of a portion of a semiconductor wafer containing a lateral DMOS transistor in accordance with the invention.

FIG. 3 is a cross-section of the structure of the invention. A lateral DMOS transistor is shown, but the device is fabricated into a P+substrate wafer 35 which has a P-type epitaxial layer 36 grown thereon. The elements produced in epitaxial layer 36 are the same as those shown in FIG. 2. However, substrate 35 is electrically connected to source/body terminal 24' as shown schematically. The substrate will be soldered, or otherwise electrically connected, to a power transistor metal case or tab. The body/source connection 24 will also be electrically connected to the same case or tab.

When drain region 26 is diffused into epitaxial layer 36, it will only penetrate part way therethrough. The diffusion and layer thicknesses will be controlled so that the spacing labeled Xrt is controlled. This spacing represents the voltage at which the depletion region that extends outward from the reverse biased PN junction reaches through the epitaxial layer and contacts the P+substrate. This so-called "reach through" voltage represents a breakdown mechanism and, if it occurs at a voltage that is lower than the surface breakdown mentioned above, the actual device breakdown voltage will be confined to the semiconductor bulk and not influenced by the nature of the surface under the oxide.

If desired, additional N-type impurities can be added to the drain diffusion region 26. This can, for example, be accomplished by an ion implant applied either prior to the diffusion operation or at some later time. If N-type impurities are added to the device region 26 the behavior of the depletion region under reverse bias conditions can be varied and Xrt therefore controlled.

Figure 4:
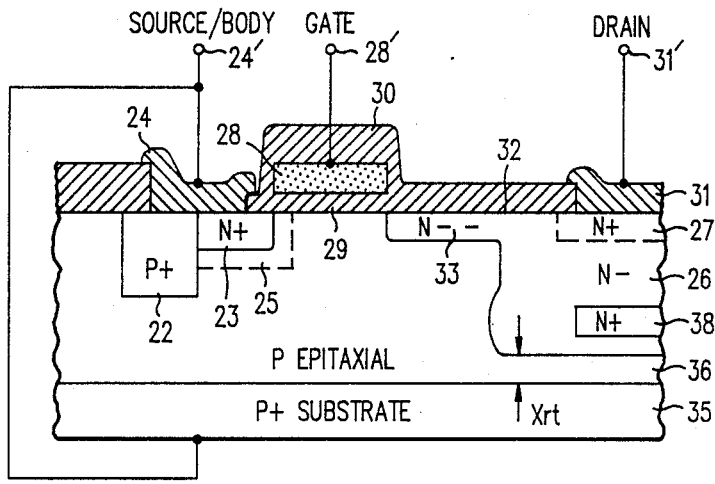
FIG. 4 is a cross-section view of a portion of a semiconductor wafer containing a lateral DMOS transistor in accordance with an alternative embodiment of the invention.

FIG. 4 shows an alternative embodiment structure that can be useful in practicing the invention. Here an N+-type buried layer 38 is created in epitaxial layer 26 just under drain region 26. Such a buried layer can be created in the structure during epitaxial layer growth. When about one-third of the total layer 36 has been achieved, the growth process is halted and a heavy deposit of N-type impurities applied in the region where the drain is to be established. Then as epitaxial growth is continued a heavy concentration of impurities is present at 38. These impurities will diffuse upward and downward during subsequent high temperature periods. The upward diffusion will cause the buried layer to merge with drain region 26. The downward diffusion will establish the value of Xrt which is thereby controlled.

Figure 5:
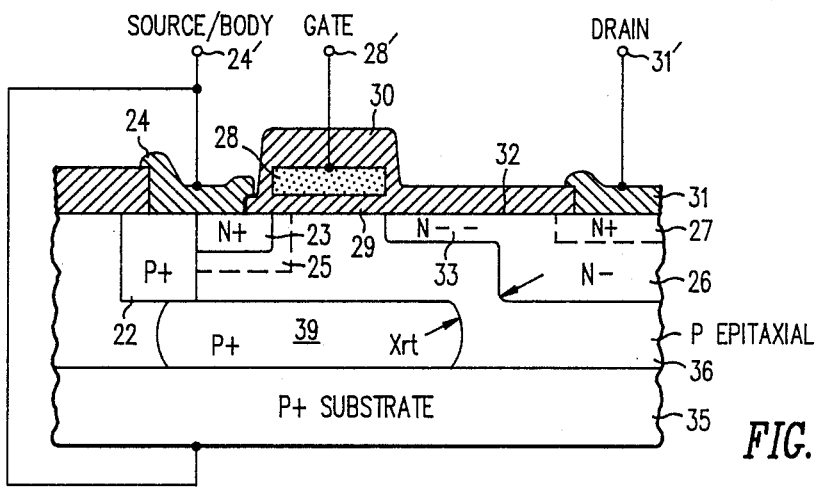
FIG. 5 is a cross-section view of a portion of a semiconductor wafer containing a lateral DMOS transistor in accordance with another alternative embodiment of the invention.

FIG. 5 shows another alternative embodiment of the invention. Here a P+ region 39 is created under the DMOS transistor off to the side of drain region 26. This region too can be created during epitaxial layer 36 growth. The layer growth is halted after about one-third complete. Then a heavy deposit of P-type impurities is applied in an area that will lie under body contact region that will be subsequently created. It will lie just outside the limits of drain region 26 that will also be subsequently created. Then, during the later high temperature intervals in device fabrication, the heavily doped region impurities will diffuse upward to contact body contact region 22 and downward to contact substrate 35. After this diffusion has been completed there is a high conductivity connection between topside contact 24 and the substrate 35. However, to ensure a reliable low resistance connection the substrate is still connected to the source/body electrode 24' as shown schematically. The closest approach of regions 26 and 39 will establish Xrt which is kept below the surface that will act to influence device avalanche breakdown.

Figure 6:
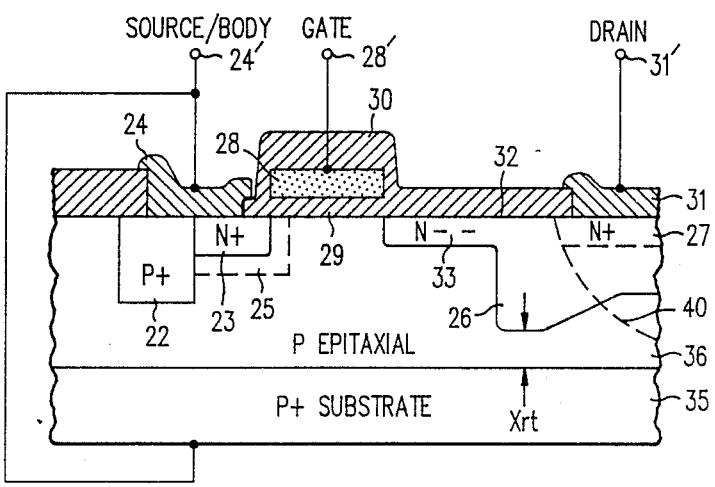
FIG. 6 is a cross-section view of a portion of a semiconductor wafer containing a lateral DMOS transistor in accordance with still another alternative embodiment of the invention.

FIG. 6 shows still another embodiment of the invention. In the explanation of FIG. 3 it was pointed out that Xrt could be influenced by the addition of N-type impurities to drain region 26. In FIG. 6, P-type impurities are added to the drain region 26. These P-type impurities will ordinarily be added to the center of of the drain diffusion region and will be applied and diffused along with P+ region 22. Dashed line 40 denotes the final diffusion limit of the added P-type impurities. It can be seen that the contour of drain region 26 will be altered and an upward directed dimple will be present as shown. The presence of the impurities will alter the manner in which the depletion region will expand as a function of PN junction bias voltage. Therefore, Xrt will be varied. However, the breakdown limit will be determined in major part by the closest approach of drain region 26 to substrate 35.

The invention has been described and alternative embodiments detailed. When a person skilled in the art reads the foregoing description, other alternatives and equivalents, within the spirit and intent of the invention, will be apparent. For instance, the polarities of the various semiconductor regions could be reversed from that described above. Accordingly, it is intended that the scope of the invention be limited only by the following claims.

I claim:

1. A DMOS transistor having source, body, gate and drain regions arrayed laterally on the surface of a semiconductor, said transistor comprising:

a substrate having a first conductivity type;

an epitaxial layer of semiconductor material having said first conductivity type and a doping level less than that of said substrate deposited on said substrate to a first thickness;

a body contact region having said first conductivity type and extending from said epitaxial layer surface part way therethrough to form an ohmic contact;

a source region having a conductivity type opposite to said first conductivity type abutting said body contact region along one edge and extending from said epitaxial layer into said epitaxial layer with the opposite edge of said source region facing said body contact region of said DMOS transistor:

a body region having said first conductivity type in said epitaxial layer and in contact with said source region;

a drain region, spaced laterally from and facing said source region and having said opposite conductivity type, extending from said epitaxial layer surface into said epitaxial layer to a second thickness that is less than said first thickness by an amount that creates a drain depletion region reachthrough breakdown voltage, associated with reverse drain bias, at a voltage level below that of an avalanche breakdown voltage of said drain electrode; and a gate region extending from said source region to said drain region;

wherein said drain region includes a region doped with impurities of said first conductivity type, said drain region having a concave shaped portion at a surface thereof facing said substrate to control the behavior of said drain depletion region under reverse bias conditions.

2. The transistor of claim 1 wherein the gate comprises:

a conductive layer spaced from said epitaxial layer surface by a thin gate oxide layer, having a first edge in register with said source region, and having a second edge located in register with said drain region.

3. The transistor of claim 2 wherein said drain region is composed of a first moderately doped portion having said second thickness and a second adjacent lightly doped portion extending to said conductive layer so as to locate said drain region in registry with said second edge thereof.

4. The transistor of claim 1 wherein said substrate and epitaxial layer are P type silicon, said source and drain regions are N type silicon, and said gate is conductive polysilicon.

5. The transistor of claim 1 wherein said substrate and epitaxial layers are N type, said source and drain are P type silicon, and said gate is conductive polysilicon.

6. A DMOS transistor having source, body, gate and drain regions arrayed laterally on the surface of a semiconductor, said transistor comprising:
   a substrate having a first conductivity type;
   an epitaxial layer of semiconductor material having said first conductivity type and a doping level less than that of said substrate deposited on said substrate to a first thickness;
   a body contact region having said first conductivity type and extending from said epitaxial layer surface part way therethrough to form an ohmic contact;
   a source region having a conductivity type opposite to said first conductivity type abutting said body contact region along one edge and extending from said epitaxial layer into said epitaxial layer with the opposite edge of said source region facing said body contact region of said DMOS transistor;
   a body region having said first conductivity type in said epitaxial layer and in contact with said source region;
   a drain region, spaced laterally from and facing said source region and having said opposite conductivity type, extending from said epitaxial layer surface into said epitaxial layer to a second thickness that is less than said first thickness by an amount that creates a drain depletion region reachthrough breakdown voltage, associated with reverse drain bias, at a voltage level below that of the avalanche breakdown voltage of said drain electrode; and
   a gate region extending from said source region to said drain region;
   wherein said drain region includes a region doped with impurities of said opposite conductivity type, said region having a doping level higher than that of a remainder of said drain region and not extending to said epitaxial layer surface, to control the behavior of its depletion region under reverse bias conditions.

7. A DMOS transistor having source, body, gate and drain regions arrayed laterally on the surface of a semiconductor, said transistor comprising:
   a substrate having a first conductivity type;
   an epitaxial layer of semiconductor material having said first conductivity type and a doping level less than that of said substrate deposited on said substrate to a first thickness;
   a body contact region having said first conductivity type and extending from said epitaxial layer surface part way therethrough to form an ohmic contact;
   a source region having a conductivity type opposite to said first conductivity type abutting said body contact region along one edge and extending from said epitaxial layer into said epitaxial layer with the opposite edge of said source region facing said body contact region of said DMOS transistor;
   a body region having said first conductivity type in said epitaxial layer and in contact with said source region;
   a drain region, spaced laterally from and facing said source region and having said opposite conductivity type, extending from said epitaxial layer surface into said epitaxial layer to a second thickness that is less than said first thickness by an amount that creates a drain depletion region reachthrough breakdown voltage, associated with reverse drain bias, at a voltage level below that of the avalanche breakdown voltage of said drain electrode; and
   a gate region extending from said source region to said drain region;
   a conductive layer spaced from said epitaxial layer surface by a thin gate oxide layer, having a first edge in register with said source region, and having a second edge located in register with said drain region;
   wherein the gate comprises a conductive layer spaced from said epitaxial layer surface by a thin gate oxide layer, having a first edge in register with said source region, and having a second edge located in register with said drain region;
   wherein said drain region is composed of a first moderately doped portion having said second thickness and a second adjacent lightly doped portion extending to said conductive layer so as to locate said drain region in registry with said second edge thereof; and
   wherein said drain region further includes a third portion of doping buried in said epitaxial layer and located to control said reachthrough breakdown voltage, said third portion being more heavily doped than the first portion of said drain region.

8. A DMOS transistor having source, body, gate and drain regions arrayed laterally on the surface of a semiconductor, said transistor comprising:
   a substrate having a first conductivity type;
   an epitaxial layer of semiconductor material having said first conductivity type and a doping level less than that of said substrate deposited on said substrate to a first thickness;
   a body contact region having said first conductivity type and extending from said epitaxial layer surface part way therethrough to form an ohmic contact;
   a source region having a conductivity type opposite to said first conductivity type abutting said body contact region along one edge and extending from said epitaxial layer surface into said epitaxial layer with the opposite edge of said source region facing said body contact region of said DMOS transistor;
   a body region having said first conductivity type in said epitaxial layer and in contact with said source region;
   a drain region, spaced laterally from and facing said source region and having said opposite conductivity type, extending from said epitaxial layer surface into said epitaxial layer to a second thickness that is less than said first thickness; and
   a gate region extending from said source region to said drain region;

wherein a high conductivity buried layer, having said first conductivity type, extends in said epitaxial layer to electrically contact at a lower edge of said buried layer said substrate and to join said substrate to said body contact regions and has a side edge that confronts said drain region at a distance so as to control a reachthrough breakdown voltage at a voltage level below that of an avalanche breakdown voltage of said drain electrode.

* * * * *

UNITED STATES PATENT AND TRADEMARK OFFICE
CERTIFICATE OF CORRECTION

PATENT NO. : 4,929,991
DATED : May 29, 1990
INVENTOR(S) : Richard A. Blanchard It is certified that error appears in the above-identified patent and that said Letters Patent is hereby corrected as shown below:

Title page:
Item (73). "Incorporated" should read --incorporated--.

Col. 1, line 6, "078,119,761" should read --07/119,761--.

Col. 1, line 19, after "produced" please insert --.--.

Col. 2, line 14, "our" should read --out--.

Col. 3, lines 15, 21, "N --region" should read N--region--.

Signed and Sealed this

Twenty-eighth Day of April, 1992

Attest:

HARRY F. MANBECK, JR.

*Attesting Officer*　　　　*Commissioner of Patents and Trademarks*